(12) United States Patent
Reznicek et al.

(10) Patent No.: US 10,340,221 B1
(45) Date of Patent: Jul. 2, 2019

(54) STACKED FINFET ANTI-FUSE

(71) Applicant: International Business Machines Corporation, Armonk, NY (US)

(72) Inventors: Alexander Reznicek, Troy, NY (US); Oscar Van Der Straten, Guilderland Center, NY (US); Praneet Adusumilli, Somerset, NJ (US); Keith E. Fogel, Hopewell Junction, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/905,961

(22) Filed: Feb. 27, 2018

(51) Int. Cl.
*H01L 21/00* (2006.01)
*H01L 23/525* (2006.01)
*H01L 29/78* (2006.01)

(52) U.S. Cl.
CPC ...... *H01L 23/5252* (2013.01); *H01L 23/5256* (2013.01); *H01L 29/785* (2013.01)

(58) Field of Classification Search
CPC .................. H01L 29/785; H01L 23/5256
See application file for complete search history.

(56) References Cited

U.S. PATENT DOCUMENTS

| | | | |
|---|---|---|---|
| 9,263,385 B1 * | 2/2016 | Singh | G11C 17/16 |
| 9,559,013 B1 * | 1/2017 | Balakrishnan | H01L 21/823814 |
| 9,601,428 B2 * | 3/2017 | Wong | H01L 23/5256 |
| 9,735,165 B1 * | 8/2017 | Adusumilli | H01L 27/11206 |
| 9,831,254 B1 | 11/2017 | Adusumilli et al. | |
| 10,043,746 B1 * | 8/2018 | Cheng | H01L 23/5256 |
| 10,056,391 B2 * | 8/2018 | Adusumilli | H01L 27/11206 |
| 10,084,090 B2 * | 9/2018 | Cheng | H01L 29/7849 |
| 2016/0284643 A1 * | 9/2016 | Wong | H01L 23/5256 |
| 2016/0322392 A1 | 11/2016 | Mochizuki et al. | |

* cited by examiner

*Primary Examiner* — Nicholas J Tobergte
(74) *Attorney, Agent, or Firm* — Patterson + Sheridan, LLP

(57) ABSTRACT

A method and apparatus for forming a semiconductor structure is provided. The semiconductor structure comprises a stacked fin structure formed on a surface of a first insulator layer. The stacked fin structure comprises a first doped semiconductor fin portion and a second doped semiconductor fin portion. The anti-fuse structure further comprises a first highly doped diamond shaped epitaxial structure grown about the first semiconductor fin portion and a second diamond shaped highly doped epitaxial structure grown about the second semiconductor fin portion. The first highly doped epitaxial structure has a lower-most apex overlying and aligned with an upper-most apex of the second highly doped epitaxial structure. The lower-most apex is separated from the upper-most apex by a gap. A second insulating layer formed about the first highly-doped epitaxial structure and the second highly-doped epitaxial structure, wherein the second insulator layer fills the gap.

20 Claims, 11 Drawing Sheets

STACKED FINFET ANTI-FUSE

BACKGROUND

The present invention relates to semiconductor technology, and more specifically, to a semiconductor-based anti-fuse made from a stacked FinFET structure and a method of forming the same.

An anti-fuse is an electrical device that performs the opposite function of a fuse. Whereas a fuse initially has a low resistance and is designed to permanently break an electrically conductive path (typically when the current through the path exceeds a specified limit), an anti-fuse initially has a high resistance and is designed to permanently create an electrically conductive path (typically when the voltage across the anti-fuse exceeds a certain level).

Programmable on-chip anti-fuses are needed in many semiconductor integrated circuit applications. In some applications, it preferable to fabricate on-chip anti-fuses during stacked FinFET CMOS fabrication in order to minimize process cost and improve system integration. The breakdown voltage of conventional planar anti-fuses with a gate dielectric is too high. Also, planar anti-fuses use too much area compatible with current ground rules of 14 nm, 10 nm or 7 nm technology nodes. Therefore, there is a need for improved on-chip stacked FinFET compatible anti-fuses.

SUMMARY

According to one embodiment of the present invention, a method provides a stacked fin structure on a surface of a first insulator layer, the stacked fin structure comprising a first semiconductor fin portion, an insulator fin portion, and a second semiconductor fin portion. The method dopes the first semiconductor fin portion and the second semiconductor fin portion. The method removes the insulator fin portion. The method grows a first highly doped epitaxial structure about the first semiconductor tin portion and a second highly doped epitaxial structure about the second semiconductor fin portion. The first highly doped epitaxial structure has lower-most apex overlying, and aligned with an upper-most apex of the second highly doped epitaxial structure. The lower-most apex separated from the upper-most portion by a gap. The method forms a second insulating layer about the first highly-doped epitaxial structure and the second highly-doped epitaxial structure. The second insulator layer fills the gap.

According to another embodiment of the present invention, an anti-fuse structure comprises a stacked fin structure formed on a surface of a first insulator layer. The stacked fin structure comprises a first doped semiconductor fin portion and a second doped semiconductor fin portion. The anti-fuse structure further comprises a first highly doped diamond shaped epitaxial structure grown about the first semiconductor fin portion and a second diamond shaped highly doped epitaxial structure grown about the second semiconductor fin portion. The first highly doped epitaxial structure has a lower-most apex overlying and aligned with an upper-most apex of the second highly doped epitaxial structure. The lower-most apex is separated from the upper-most apex by a gap. A second insulating layer formed about the first highly-doped epitaxial structure and the second highly-doped epitaxial structure, wherein the second insulator layer fills the gap.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
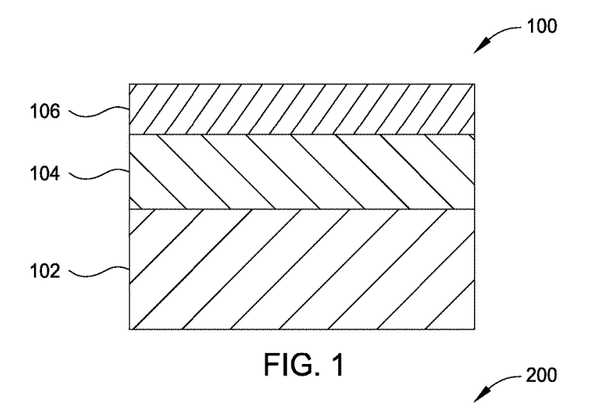
FIG. 1 shows a semiconductor-on-insulator (SOI) substrate.

FIG. 1 shows a semiconductor-on-insulator (SOI) substrate 100. In one embodiment, the SOI substrate 100 may comprise a first semiconductor material layer 102 known as a handle wafer underlying a first insulator layer 104, and a second semiconductor material layer 106 known as a seed layer overlying the first insulating layer 104.

Figure 2:
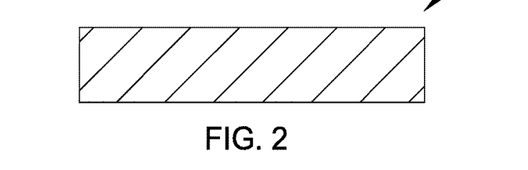
FIG. 2 shows a semiconductor substrate.
Figure 3:
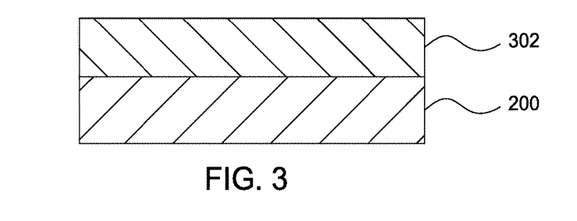
FIG. 3 shows the semiconductor substrate after forming an insulator layer on the semiconductor substrate.
Figure 4:
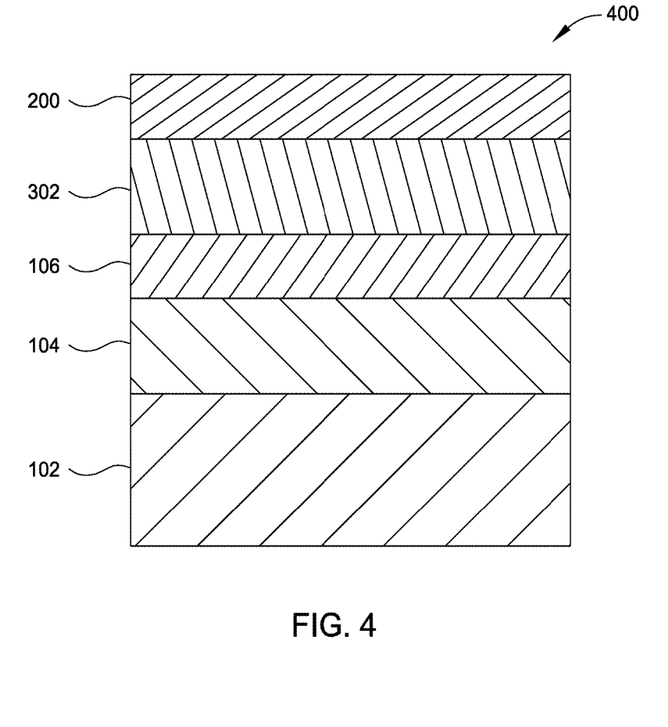
FIG. 4 shows a cross-sectional view of an initial processing substrate for producing FinFET anti-fuse structures.

FIG. 2 shows a semiconductor substrate 200. FIG. 3 shows the semiconductor substrate 300 after forming an insulator layer 302 on the semiconductor substrate 300. FIG. 4 shows a cross-sectional view of an initial processing substrate 400 for producing stacked FinFET anti-fuse structures. The initial processing substrate 400 is formed by fusing the insulator layer 302 of the semiconductor substrate 200 to the second semiconductor material layer 106 of the SOI substrate 100 utilizing any well-known wafer bonding process.

The first semiconductor material layer 102 comprises any semiconductor material or multilayered stack of semiconductor materials having semiconducting properties; the first semiconductor material layer 102 is a bulk semiconductor substrate meaning that the substrate contains no insulator materials and/or conductive materials. Illustrative examples of semiconductor materials that can be employed as the first semiconductor material layer 102 include, but are not limited to, silicon (Si), germanium (Ge), silicon germanium alloys (SiGe), III-V compound semiconductors and/or II-VI compound semiconductors. III-V compound semiconductors include at least one element from Group III (i.e., Group 13) of the Periodic Table of Elements and at least one element from Group V (i.e., Group 15) of the Periodic Table of Elements, while II-VI compound semiconductors include at least one element from Group II (i.e., Group 2) of the Periodic Table of Elements and at least one element from Group VI (i.e., Group 16) of the Periodic Table of Elements). In one example, the first semiconductor material layer 102 may be entirely composed of single crystal silicon.

The semiconductor material layers 102, 106, 200 and any other semiconductor material layer that are employed may include one of the semiconductor materials mentioned above for initial processing substrate 400. In one embodiment, the semiconductor material layers 106, 200 and any other semiconductor material layer that are employed may include a same semiconductor material as the semiconductor material layer 102. In another embodiment of the present application, the semiconductor material layers 106, 200 and any other semiconductor material layer that are employed may include a semiconductor material that differs from the semiconductor material of the first semiconductor material layer 102.

In one embodiment of the present application, the semiconductor material layers 102, 106 and any other semiconductor material layer that are employed may each include a same semiconductor material. In another embodiment, at least one of the semiconductor material layers includes a semiconductor material that differs from a semiconductor material of another semiconductor material layer. For example, the first semiconductor material layer 102 may be composed of silicon, while the second semiconductor material layer 106 may be composed of a silicon germanium alloy or a III-V compound semiconductor.

In the present application, the semiconductor material layers 106, 200 and any other semiconductor material layer that are employed are single crystalline semiconductor materials that are non-doped. In the present application, the semiconductor material layers 106, 200 and any other semiconductor material layer that are employed may have a thickness from 10 nm to 200 nm; other thicknesses are possible and are thus not excluded from being used in the present application.

The insulator layers 104, 302 and any other insulator layer that are employed to separate a bottom semiconductor material layer from a top semiconductor material layer may include a crystalline or non-crystalline dielectric oxide or dielectric nitride. In one example, the insulator layers 104, 302 and any other insulator layer that are employed to separate a bottom semiconductor material layer from a top semiconductor material layer may be composed of silicon dioxide.

In one embodiment, the insulator layers 104, 302 and any other insulator layer that are employed to separate a bottom semiconductor material layer from a top semiconductor material layer may comprise a same dielectric material. In another embodiment of the present application, at least one of the insulator layers used to separate a bottom semiconductor material layer from a top semiconductor material layer is composed of a dielectric material that differs from another insulator layer that performs the same function. For example, insulator layer 104 may be composed of silicon dioxide, while insulator layer 402 may be composed of silicon nitride.

In the present application, the insulator layers 104, 302 and any other insulator layer that are employed to separate a bottom semiconductor material layer from a top semiconductor material layer may have a thickness from 10 nm to 100 nm; other thicknesses are possible and are thus not excluded from being used in the present application.

Figure 5A:
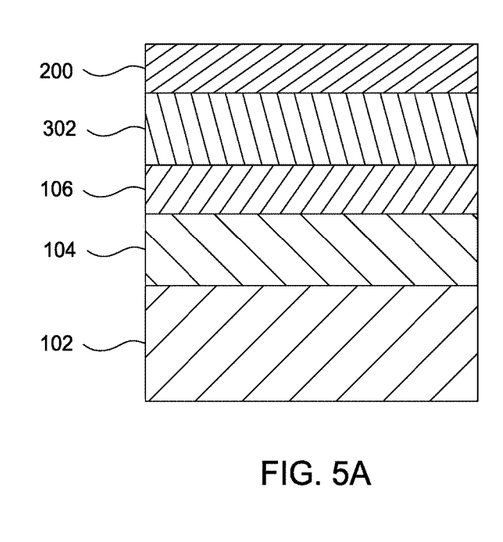
FIG. 5A shows a side view of an exemplary semiconductor device after forming a stack of stacked fin structures from the initial processing substrate.
Figure 5B:
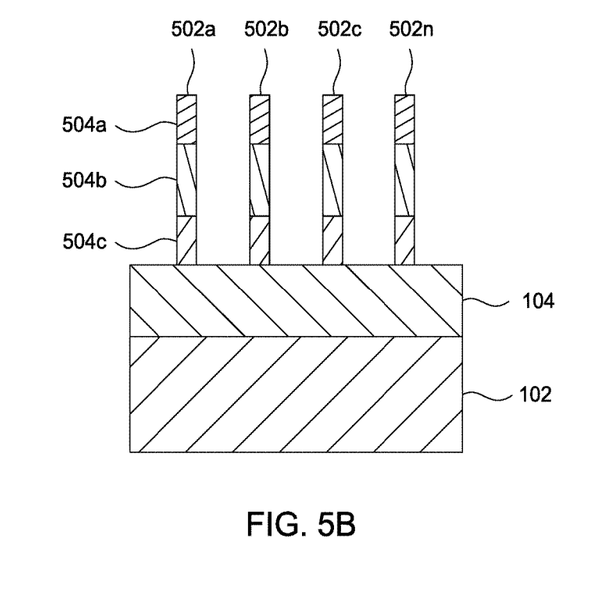
FIG. 5B shows a cross sectional view of FIG. 5A.

FIGS. 5A and 5B show an exemplary semiconductor device after forming a stack of stacked fin structures 502a-502n from the initial processing substrate 400. As used herein, a "stacked fin structure" refers to a contiguous material stack of semiconductor materials and dielectric materials, and including a pair of vertical sidewalls that are parallel to each other. As used herein, a surface is "vertical" if there exists a vertical plane from which the surface does not deviate by more than three times the root mean square roughness of the surface. In one embodiment of the present application, each stacked fin structure 502a-502n may have a width from 4 nm to 30 nm; the height of each stacked fin structure 502a-502n may be from 10 nm to 150 nm. Other widths and heights that are lesser than, or greater than the ranges mentioned herein can also be used in the present application. Each stacked fin structure 502a-502n can be separated by a gap 510 that has a width, w1, from 20 nm to 50 nm. Each stacked fin structure 502a-502n has a first semiconductor fin portion 504a, an insulator fin portion 504b, and a second semiconductor fin portion 504c formed from corresponding semiconductor material layer 106, semiconductor material layer 300, and insulating layer 402. As is shown in FIG. 5, the sidewall surfaces of each of the first semiconductor fin portion 504a, the insulator fin portion 504b and the second semiconductor fin portion 504c are vertically aligned with each other.

Each stacked fin structure 502a-502n may be formed utilizing a patterning process. In one embodiment, the patterning process used to define each stacked fin structure 502a-502n may include lithography and etching. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. In the present application, the etch stops on a surface of the insulator layer 204.

In another embodiment, the patterning process may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

In yet another embodiment, the patterning process may include a direct self-assembly (DSA) patterning process.

Figure 6A:
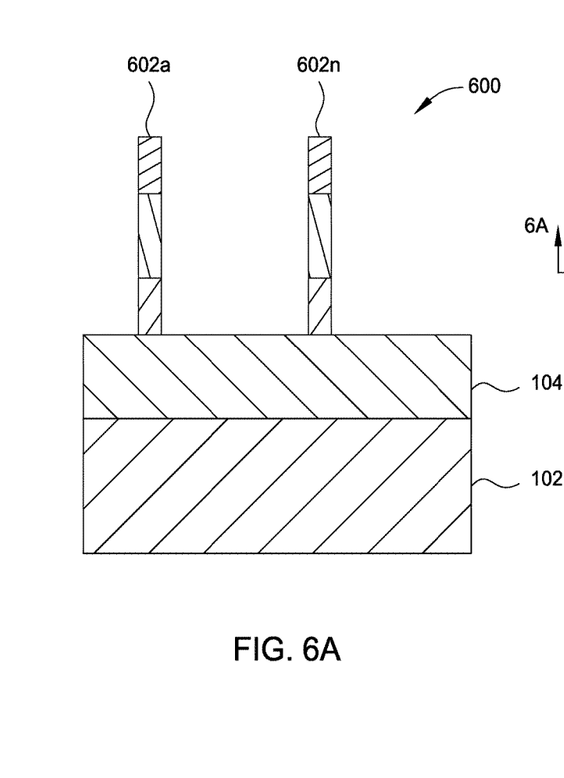
FIG. 6A illustrates a stacked fin structure after removing some of the semiconductor fins of the plurality of semiconductor fins of FIGS. 5A and 5B, while maintaining at least one semiconductor fin of the plurality of semiconductor fins on a substrate.
Figure 6B:
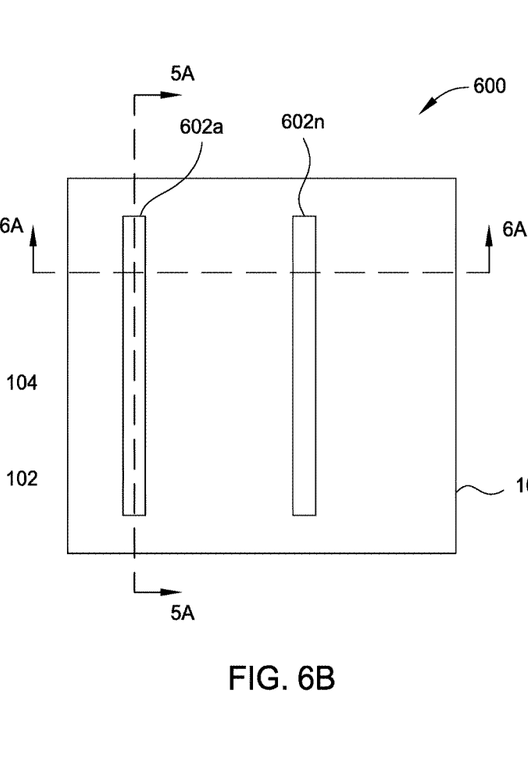
FIG. 6B is a top down view of FIG. 6A taken along the vertical axis 5A and the horizontal axis 6A.

Referring now to FIGS. 6A and 6B, there is illustrated a stacked fin structure 600 after removing some of the semiconductor fins of the plurality of semiconductor fin portions 504a-504n of FIGS. 5A and 5B, while maintaining at least one semiconductor fin 602a-602n of the plurality of semiconductor fins on a substrate 604. In what is known as a fin-cut method, some of the semiconductor fins are removed. Fin cut is a mask, which allow certain fins or sections of fins to be cut (e.g., every other fin or every third fin) for specific circuit designs and in the described here to make space for the final structure for the remaining fins 602a-602n to fit on the substrate 604. Fin cut is not for making space, but to create the circuit and designs one needs. In an embodiment, Fin cut is employed to make space. If alternating fins are not removed (locally), then the epitaxial diamond structures on two neighboring stacked FinFET anti-fuses would merge The removal of some of the semiconductor fins can be achieved by forming a block mask over each semiconductor fin 602a-602n that is to remain in the structure, and then the exposed semiconductor fins can be removed utilizing a selective etch process. After removing some of the semiconductor fins, the block mask is removed utilizing a block mask stripping process.

Figure 7A:
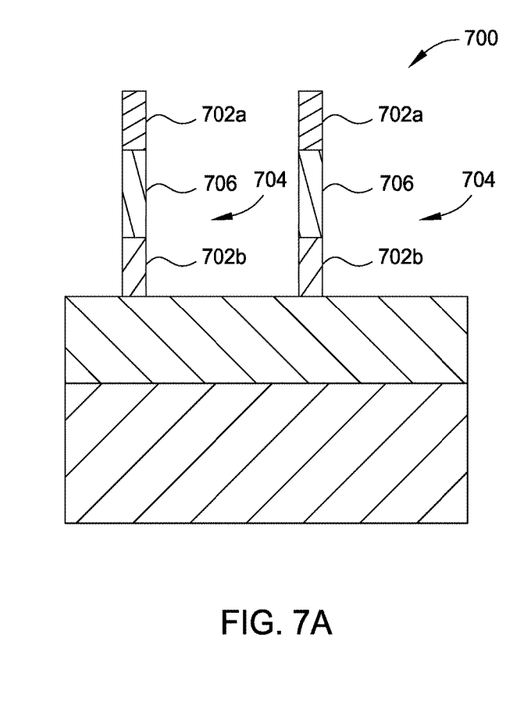
FIG. 7A illustrates a stacked fin structure after forming a doped stacked fin structure having a doped first semiconductor fin portion and a second doped semiconductor fin portion.
Figure 7B:
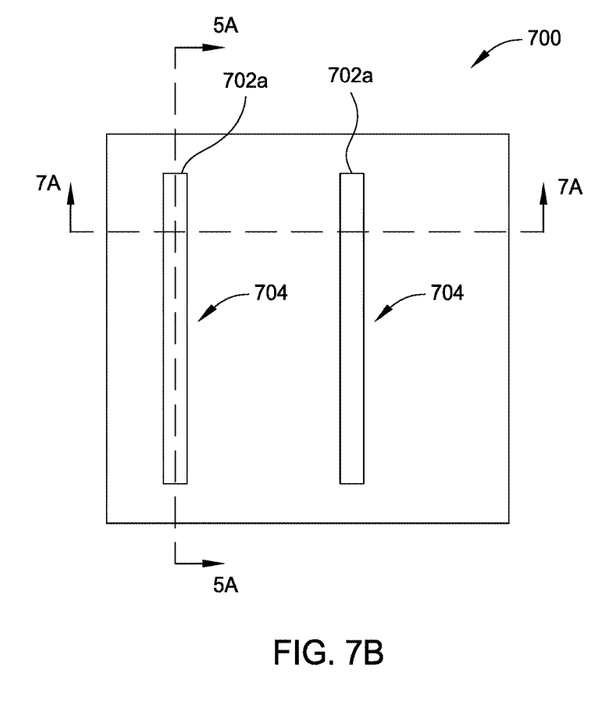
FIG. 7B is a top down view of FIG. 6A taken along the vertical axis 5A and the horizontal axis 7A.
Figures 8A, 8B:
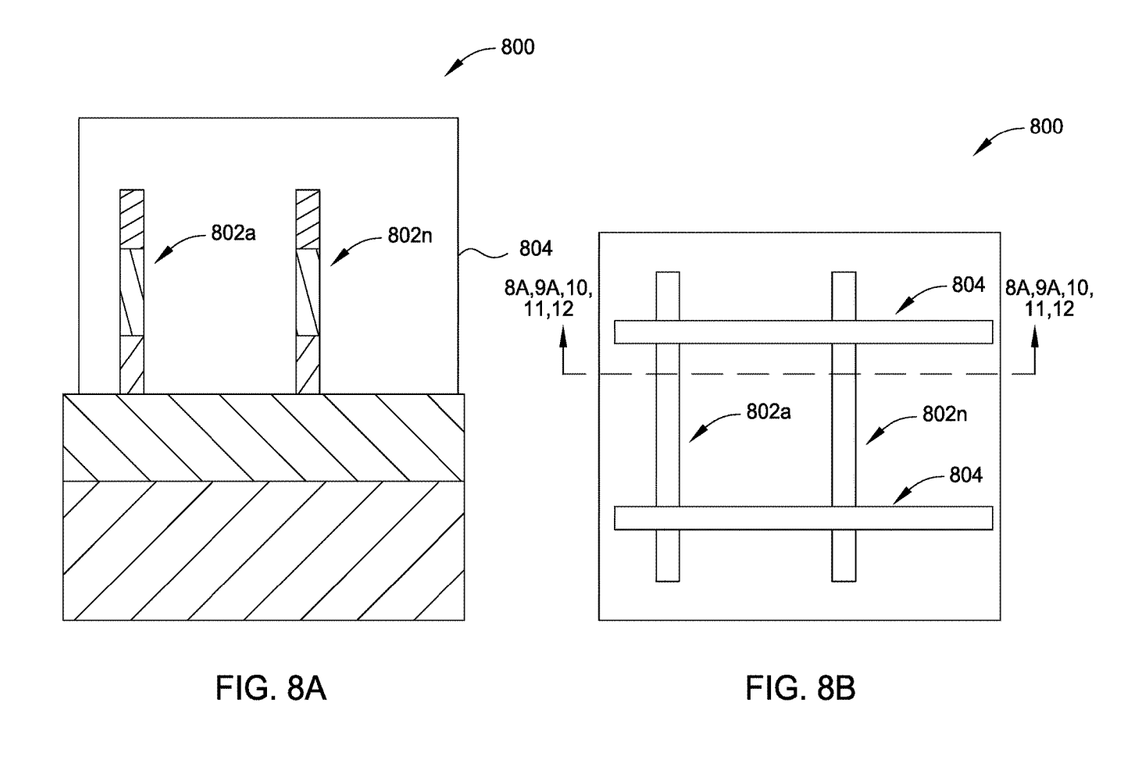
FIGS. 8A and 9A illustrate a semiconductor structure after forming dummy gate structure straddling over a portion of each stacked fin structure.
FIGS. 8B and 9B are side views of FIGS. 8A and 9A, respectively.
Figure 9A:
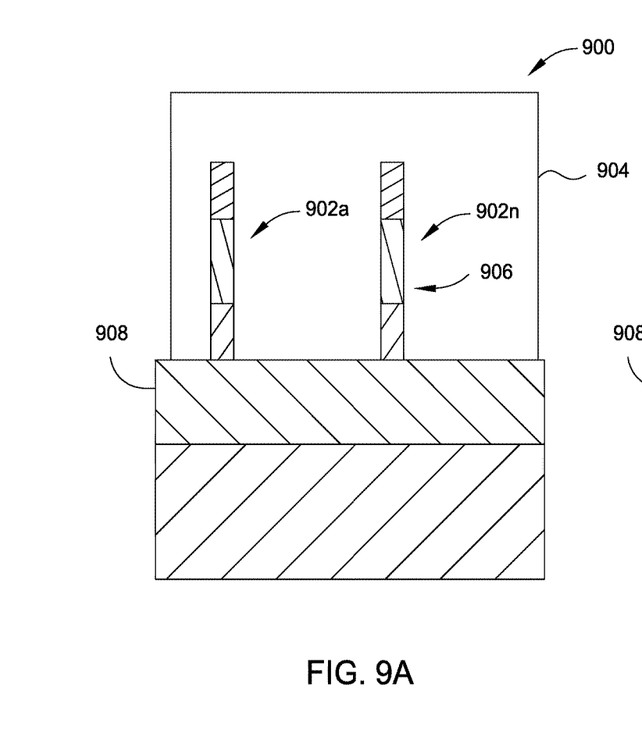
Figure 9B:
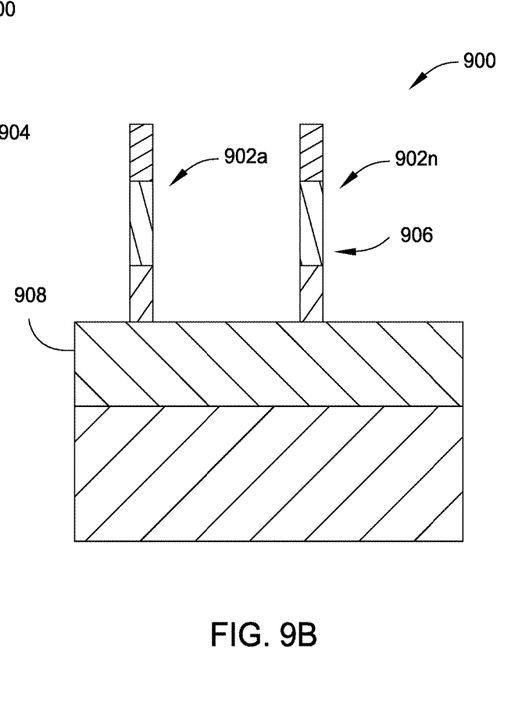

Referring now to FIGS. 7A and 7B, there is illustrated a stacked fin structure 700 after forming a doped stacked fin structure 700 having a doped first semiconductor fin portion 702a and a second doped semiconductor fin portion 702b. In an embodiment, the first doped semiconductor fin portion 702a and the second doped semiconductor fin portion 702b of each of the remaining semiconductor fins 704 is gas-phase doped to form a p-type or n-type material. Each of the first doped semiconductor fin portions 702a and the second doped semiconductor fin portions 702b of each of the remaining semiconductor fins 704 includes a semiconductor material and a p-type or n-type dopant. In such an embodiment, an insulating material interface comprising the insulator layer 706 exists between the first doped semiconductor fin portions 702a and the second doped semiconductor fin portions 702b The doped stacked fin structure 700 may be annealed in a dopant gas (e.g., Arsine, Phosphine, or Diborane) inert gas mixture (hydrogen, Argon, Helium). After gas phase doping, the dopant concentration of fin portions 702a and 702b is $5 \times 10^{18}$ to $5 \times 10^{20}$ atom/cm$^3$. In another embodiment, plasma doping may be employed to dope the exposed fin sections.

The term "n-type dopant" refers to an impurity that when added to an intrinsic semiconductor material contributes free electrons to the intrinsic semiconductor material. In a silicon containing material, examples of n-type dopants include, but are not limited to, antimony, arsenic and/or phosphorus. The term "p-type dopant" refers to an impurity that when added to an intrinsic semiconductor material creates to deficiencies of valance electrons. In a silicon containing semiconductor material, examples of p-type dopants include, but are not limited to, boron, aluminum, gallium and/or indium Referring now to FIGS. 8A, 8B and 9A, 9B, there are illustrated a semiconductor structure 800 after forming dummy gate structure 804 straddling over a portion of each stacked fin structure 802a-802n. The dummy gate structures 804, 904 are configured to anchor the stacked fin structures 802a, 902a-802n, 902n to hold the stacked fin structures 802a, 902a-802n, 902n in place during fin disconnect. The number of gate structures can vary so long as at least one gate structure 804 is formed. Each gate structure 804, 904 is orientated perpendicular to a given stacked fin structure (e.g., 802a, 902a). Each gate structure 804, 904 that is formed is a dummy or non-functional gate structure which is employed in the present application as an anchoring element. Each gate structure 804, 904 may include a single material or a material stack of different materials. In one example, the gate structure 804, 904 may include a sacrificial gate material such as, for example, polysilicon. In another example, the gate structure 804, 904 may include a sacrificial gate dielectric material (i.e., silicon dioxide) and a sacrificial gate material. Each gate structure 804, 904 can be formed by deposition, followed by lithography and etching to define the gate structure 804, 904.

Figure 10:
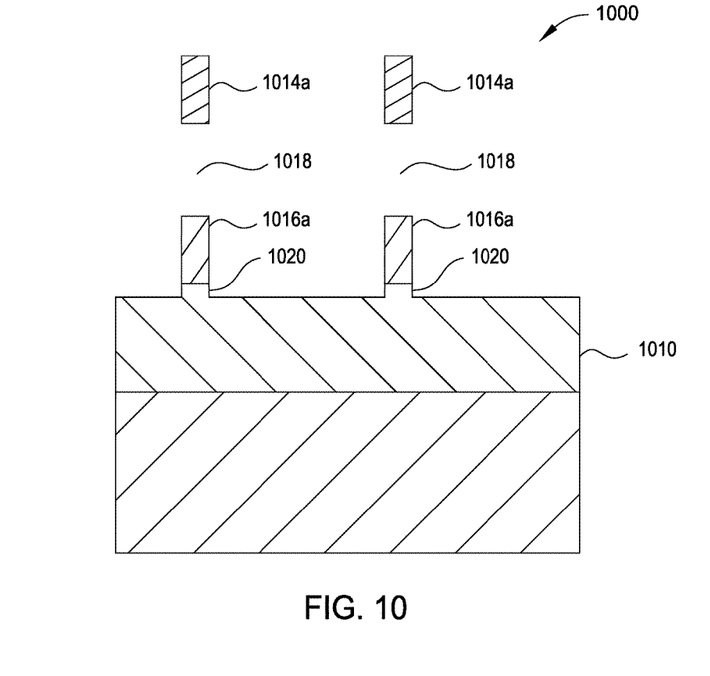
FIG. 10 illustrates a semiconductor structure after removing each insulator fin portion of each stacked fin structure, wherein the remaining conductive semiconductor fin portion are held in place by the dummy gate structures.

Referring now to FIG. 10, there is illustrated a semiconductor structure 900 after removing each insulator fin portion of each stacked fin structure 902a, 902b wherein the remaining stacked fin structures 902a, 902b are held in place by the dummy gate structures 904. Each insulator fin portion of each stacked fin structure 902a, 902b can be removed utilizing an etching process that is selective in removing the dielectric material that provides each insulator fin portion. In one example, each insulator fin portion can be removed utilizing hydrofluoric acid or a buffered oxide etch (a solution containing a mixture of ammonium fluoride and hydrofluoric acid). 1 embodiments in which each insulator fin portion 1006 and the insulator layer 1008 are composed of a same dielectric material, an upper portion of the insulator layer 1008 not protected by a stacked fin structure 902a, 902b and be removed.

As is shown, a plurality of vertically stacked conductive semiconductor fin portions 1014a, 1014b located one atop the other is provided. Each conductive semiconductor fin portion 1014a, 1014b is spaced apart from each other by a gap 1018. As is further shown in the illustrated embodiment of FIG. 10, a bottommost semiconductor fin portion (i.e., first conductive semiconductor fin portion 1014a) of each vertically stacked conductive semiconductor fin portion 1014a, 1014b has a bottommost surface that is in direct physical contact with a mesa surface 1020 of a remaining portion of the insulator layer 1010. The bottommost conductive semiconductor fin portion (i.e., the first conductive fin portion 1014a) has sidewall surfaces that are vertically aligned to sidewall surfaces of the mesa surface 1020. Moreover, each overlying conductive semiconductor fin portion present above the bottommost conductive semiconductor fin portion has sidewall surfaces that are vertically aligned to the sidewall surfaces of the bottommost conductive semiconductor fin portion, i.e., the sidewall surfaces of conductive semiconductor fin portion 1014a are vertically aligned to the sidewall surfaces of the conductive semiconductor fin portion 1014a, which in turn is vertically aligned to the sidewall surfaces of the mesa surface 1020.

Figure 11:
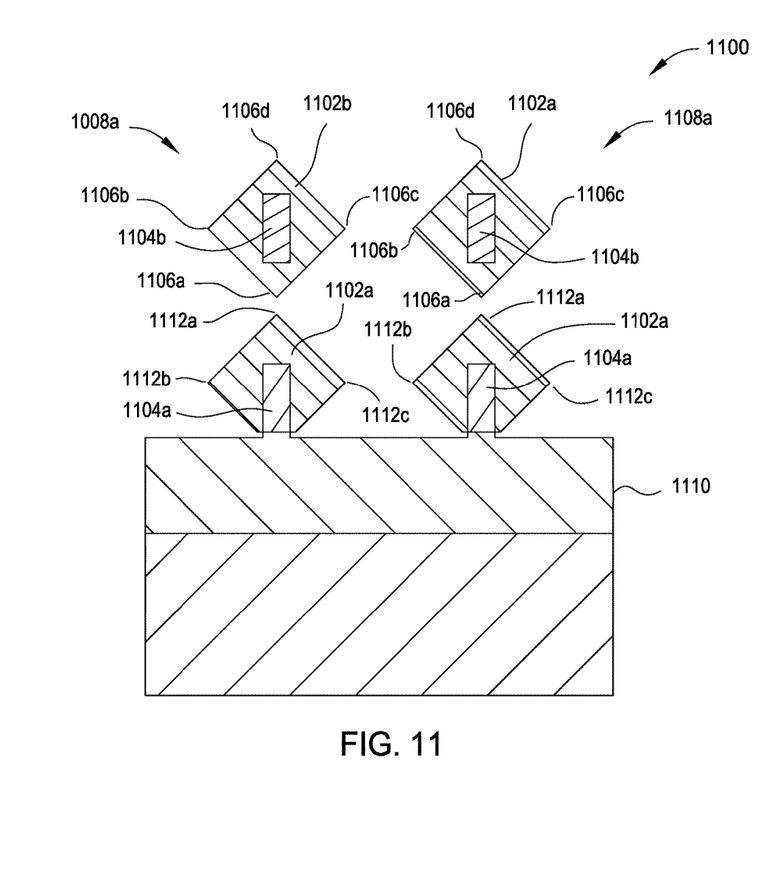
FIG. 11 illustrates a semiconductor structure after growing doped epitaxial structures about each of the fin portions.

Referring now to FIG. 11, there is illustrated a semiconductor structure 1100 after growing highly-doped epitaxial structures 1102a, 1102b about each of the fin portions 1104a, 1104b. The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

The highly-doped epitaxial structures 1102a, 1102b are grown in such a way as to avoid filling in gaps 1106a, 1106b between fin portions 1104a, 1104b. When multiple doped semiconductor material structures 1108a, 1108b are formed, each doped semiconductor material structure 1108a, 1108b is separated from its nearest neighboring doped semiconductor material structure 1108a, 1108b by gap 1106a, 1106b. Thus, each doped semiconductor material structure 1108a, 1108b remains unmerged and each doped semiconductor material structure 1108a, 1108b is not in intimate contact with another doped semiconductor material structure 1108a, 1108b.

Each doped semiconductor material structure 1108a, 1108b has one sidewall surface that has a sharp corner and thus this sidewall of the faceted structures is not perpendicular with the horizontal surface of the underlying substrate 1110. The fin sidewall has a (110) orientation the substrate has a (100)-oriented surface; and the diamond shaped epitaxy structure has (111)-surfaces. In one embodiment, and as is illustrated, each doped semiconductor material structure 1108a, 1108b is diamond shaped. Each lower diamond shaped doped semiconductor material structure, 1108b has three apexes or tips 1112a-1112c; one of the apexes or tips 1112a is positioned directly over a topmost surface of a semiconductor fin 1104a, the other two apexes or tips 1112b, 1112c are located on opposing sides of a semiconductor fin 1104a. The two apexes or tips 1112b, 1112c located on opposing sides of the semiconductor fin 1104a represent an outermost portion of a triangularly shaped material that is epitaxially grown from each sidewall of the semiconductor fin 1104a. The apex or tip 1112a located directly above the topmost surface of the semiconductor fin 1104a represents an outermost portion of the two triangular shapes that merge above the semiconductor fin 1104a and provide the diamond shaped doped semiconductor material structure 1108b shown. In some embodiments, the doped semiconductor material structure 1108b is bounded by (111) planes to each sidewall of the semiconductor fin 1104a. Each upper diamond shaped doped semiconductor material structure 1108a has four apexes or tips 1106a-1106c; one of the apexes or tips 1106a is positioned directly over a topmost surface of a semiconductor fin 1104b, two apexes or tips 1112b, 1112c are located on opposing sides of a semiconductor fin 1104b, and a bottom apex 1106d faces the upper apex 1112a of the lower semiconductor fin 1104b. The lower most apex 1106d and the upper most apex 1112a are spaced 1 nm to 5 nm apart, with 2 nm to 3 nm preferred and may be misaligned by no more than 2 nanometers.

Each doped semiconductor material structure 1108a, 1108b can be formed utilizing a selective epitaxial growth process. In a selective epitaxial growth process, semiconductor material used in providing each doped semiconductor material structure 1108a, 1108b is grown only from exposed surfaces of another semiconductor material, i.e., the semiconductor fins 1104a, 1104b. The dopant can be added during the epitaxial growth process. The initial dopant concentration of the highly doped semiconductor material structure 1108a, 1108b may be between $2 \times 10^{20}$ to $2 \times 10^{22}$ atom/cm$^3$. The doping level of the highly doped semiconductor material structure 1108a, 1108b and the doped semiconductor fin portions 702a, 702b in the final anti-fuse structure may be the same: $5 \times 10^{18}$ atoms/cm3 to $2 \times 10^{21}$ atoms/cm$^3$, due to thermal budget encountered by logic device processing. Source/drain junction anneal may diffuse dopants from the highly doped semiconductor material structure 1108a, 1108b into the doped semiconductor fin portions 702a, 702b, leading to the same doping level everywhere.

Since an epitaxial growth process is used in providing each highly doped semiconductor material structure 1108a, 1108b, each doped semiconductor material structure 1108a, 1108b has an epitaxial relationship with the exposed growth surfaces of a semiconductor fin 1104a, 1104b.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of each doped semiconductor material structure 1108a, 1108b can be performed utilizing any well-known precursor gas or gas mixture. Carrier gases like hydrogen, nitrogen, helium and argon can be used. As mentioned above, a dopant source can be introduced into the precursor or precursor gas mixture during the epitaxial growth of each doped semiconductor material structure 1108a, 1108b.

Figure 12:
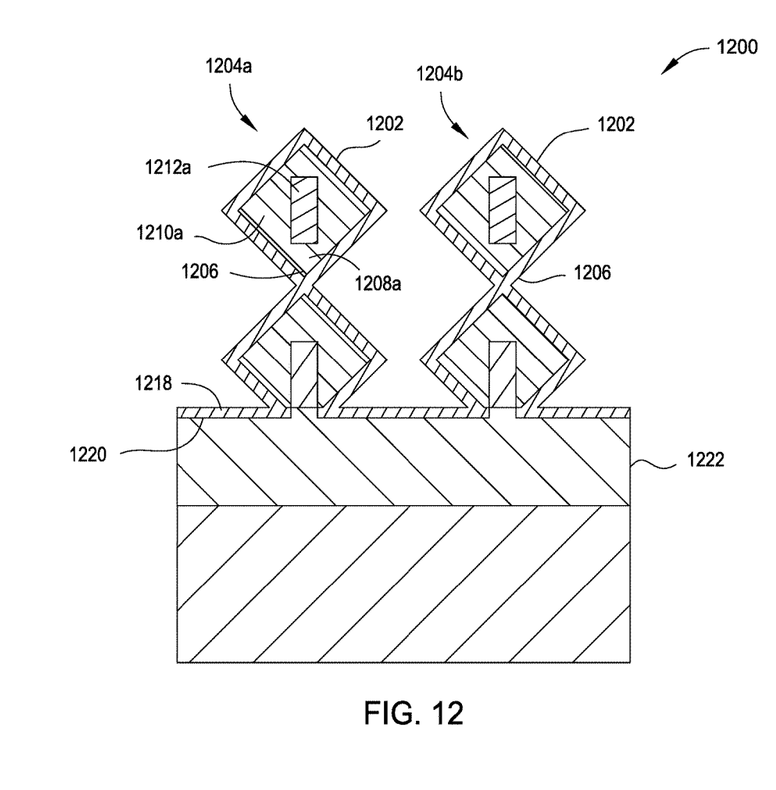
FIG. 12 illustrates a semiconductor structure after forming a dielectric layer about each of the doped semiconductor material structure.

Referring now to FIG. 12, there is illustrated a semiconductor structure 1200 after forming a dielectric layer 1202 about each of the doped semiconductor material structure 1204a, 1204b. The dielectric layer 1202 may be formed using an atomic layer deposition (ALD) process. The dielectric layer 1202 fills the gap 1206 between a lower most apex 1208a of an upper fin 1210a and the upper most apex 1208b of the lower fin 1210b. The conductive portion 1212a of the upper doped semiconductor material structure 1204a, the intervening dielectric layer 1202 in the gap 1206, and the lower doped semiconductor material structure 1204b form a FinFET anti-fuse structure. The dielectric layer 1202 may be, for example, an oxide liner. The dielectric layer 1202 may be formed by a deposition process, followed by an optional planarization process. After forming the dielectric layer 1202, other regions of the substrate including other devices, such as, for example, stacked in FETs, can be initially processed. For example, source/drain regions, and/or gate spacers can be formed within a device region in which a FinFET is to be formed. The dielectric layer 1202 is formed on the entirety of each doped semiconductor material structure 1204a, 1204b (including the faceted surfaces) as well as the exposed portions 1218 of the topmost surface 1220 of the remaining portion of the substrate 1222.

The dielectric layer 1202 is composed of a same dielectric material as that used in providing a gate dielectric of a functional gate structure (not shown). The dielectric layer 1202 may include a dielectric oxide, dielectric nitride, and/or dielectric oxynitride. In one example, the dielectric material that provides the dielectric layer 1202 as well as the gate dielectric of the functional gate structure can be a high-k material having a dielectric constant greater than silicon dioxide. Exemplary high-k dielectrics include, but are not limited to, HfO2, ZrO2, La2O3, Al2O3, TiO2, SrTiO3, LaAlO3, Y2O3, HfOxNy, ZrOxNy, La2OxNy, Al2OxNy, TiOxNy, SrTiOxNy, LaAlOxNy, Y2OxNy, SiON, SiNx, a silicate thereof, and an alloy thereof. Each value of x is independently from 0.5 to 3 and each value of y is independently from 0 to 2. In some embodiments, a multi-layered gate dielectric structure comprising different gate dielectric materials, e.g., silicon dioxide, and a high-k gate dielectric can be formed and used as the dielectric layer 1202.

The dielectric material used in providing the dielectric layer 1202 as well as the gate dielectric of the functional gate structure can be formed by any deposition process including, for example, chemical vapor deposition (CVD), plasma enhanced chemical vapor deposition (PECVD), physical vapor deposition (PVD), sputtering, or atomic layer deposition (ALD). Dielectric layer 1202 may have a thickness from 1 nm to 50 nm; although other thicknesses that are lesser than, or greater than the aforementioned thickness range can also be used as the thickness of the dielectric layer 1202

Figure 13:
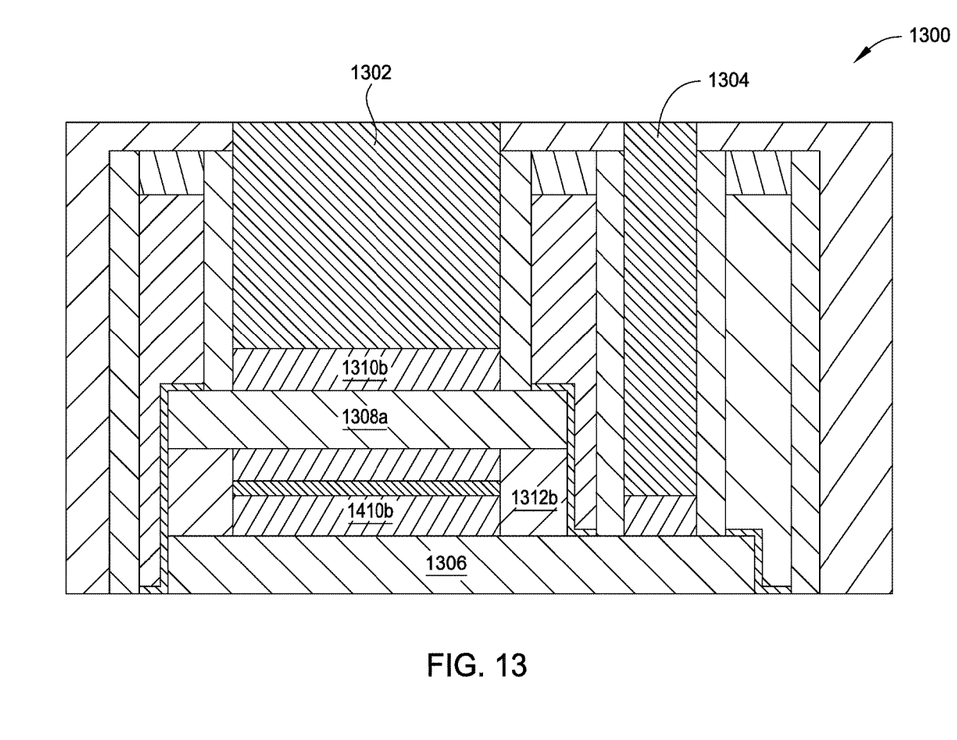
FIG. 13 illustrates a semiconductor structure after forming conductive contacts on the semiconductor structure.

Referring now to FIG. 13, there is illustrated a semiconductor structure 1300 after forming conductive contacts 1302, 1304 on the semiconductor structure 1300. FIG. 13 shows cross section in a Y-Y direction (inside the fin, along the fin) of the final semiconductor structure 1300. FIG. 13 show a contact 1302 to a top fin 1304 of the anti-fuse structure 1300 and contact 1304 to a bottom fin 1306 of the anti-fuse structure 1300.

FIG. 13 illustrates the finalized semiconductor structure 1300 of the present application that includes an anti-fuse structure located on a surface of a first insulating layer 1306. The anti-fuse structure 1300 comprises: a stacked fin structure formed on a surface of a first insulator layer, the stacked fin structure comprises a first doped semiconductor fin portion 1308a and a second doped semiconductor fin portion 1308b. The anti-fuse structure 1300 further comprises a first highly doped epitaxial structure 1310a grown about the first semiconductor fin portion 1308a and a second highly doped epitaxial structure 1310b grown about the second semiconductor fin portion 1308b. The first highly doped epitaxial structure 1310a has a lower-most apex 1312a overlying and aligned with an upper-most apex 1312b of the second highly doped epitaxial structure 1310b. The lower-most apex 1312a is separated from the upper-most apex 1412b by a gap 1314. The size of the gap 1314, or the distance between the upper-most apex and the lower most apex, is in a range of about 1 nanometers to 5 nanometers, preferably between 2 nanometers and three nanometers.

A second insulating layer 1316 formed about the first highly-doped epitaxial structure 1310a and the second highly-doped epitaxial structure 1310b, wherein the second insulator layer 1316 fills the gap 1314.

The anti-fuse structure 1300 of the present application may have reduced breakdown voltage due to field enhancement at the apexes 1312a, 1312b of the faceted surface of the first highly doped epitaxial structure 13410a and the second highly doped epitaxial structure 1310b. Further, and due to the large contact area provided by the multiple breakdown points, BP, the anti-fuse structure of the present application has a low resistance after the anti-fuse structure is blown. In addition to employing the above method of forming a stacked nanosheet structure, a similar technique can be used in a standard FINFET design to enable source/drain isolation. An epitaxial oxide can be disposed below a FINFET structure to provide the isolation.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

While the foregoing is directed to embodiments of the present invention, other and further embodiments of the invention may be devised without departing from the basic scope thereof, and the scope thereof is determined by the claims that follow.

What is claimed is:

1. A method of forming a semiconductor structure, said method comprising:
    providing a stacked fin structure on a surface of a first insulator layer, the stacked fin structure comprising a first semiconductor fin portion, an insulator fin portion, and a second semiconductor fin portion;
    doping the first semiconductor fin portion and the second semiconductor fin portion;
    removing the insulator fin portion;
    growing a first highly doped epitaxial structure about the first semiconductor fin portion and a second highly doped epitaxial structure about the second semiconductor fin portion, wherein the first highly doped epitaxial structure has lower-most apex overlying and aligned with an upper-most apex of the second highly doped epitaxial structure, the lower-most apex separated from the upper-most portion by a gap; and
    forming a second insulating layer about the first highly-doped epitaxial layer and the second highly-doped epitaxial layer, wherein the second insulator layer fills the gap.

2. The method of claim 1, wherein the semiconductor structure comprises a plurality of stacked fin structures, and further comprising removing a number of the stacked fin structures.

3. The method of claim 1, wherein the first semiconductor fin portion and the second semiconductor fin portion are diamond shaped.

4. The method of claim 1, wherein the second fin portion has a bottommost surface in direct physical contact with a mesa surface of insulator layer.

5. The method of claim 4, wherein the second semiconductor fin portion fin portion has sidewall surfaces that are vertically aligned to sidewall surfaces of said mesa surface of said insulator layer.

6. The method of claim 4, wherein each first semiconductor fin portion present above a second semiconductor fin portion has sidewall surfaces that are vertically aligned to the sidewall surfaces of the second semiconductor fin portion.

7. The method of claim 1, wherein each semiconductor fin portion comprises a same semiconductor material.

8. The method of claim 1, wherein at least one of the semiconductor fin portions comprises a semiconductor material that differs from a semiconductor material of at least one other semiconductor fin portion.

9. The method of claim 1, wherein each semiconductor fin portion comprises a same dopant type and a same dopant concentration.

10. The method of claim 1, wherein said doping comprises gas phase doping.

11. The method of claim 1, wherein the first highly doped epitaxial structure and the second highly doped epitaxial structure are gas phase doped.

12. A semiconductor-based anti-fuse structure comprising: a stacked fin structure formed on a surface of a first insulator layer, the stacked fin structure comprising:
    a first doped semiconductor fin portion and a second doped semiconductor fin portion, a first highly doped epitaxial structure grown about the first semiconductor fin portion and a second highly doped epitaxial structure grown about the second semiconductor fin portion, wherein the first highly doped epitaxial structure has a lower-most apex overlying and aligned with an upper-most apex of the second highly doped epitaxial structure, the lower-most apex separated from the upper-most apex by a gap, and a second insulating layer formed about the first highly-doped epitaxial structure and the second highly-doped epitaxial structure, wherein the second insulator layer fills the gap.

13. The anti-fuse structure of claim 12, wherein the first semiconductor fin portion and the second semiconductor fin portion are diamond shaped.

14. The anti-fuse structure of claim 12, wherein the second semiconductor fin portion has a bottommost surface in direct physical contact with a mesa surface of insulator layer.

15. The anti-fuse structure of claim 14, wherein the second semiconductor fin portion fin portion has sidewall surfaces that are vertically aligned to sidewall surfaces of said mesa surface of said insulator layer.

16. The anti-fuse structure of claim 15, wherein each first semiconductor fin portion present above a second semiconductor fin portion has sidewall surfaces that are vertically aligned to the sidewall surfaces of the second semiconductor fin portion.

17. The anti-fuse structure of claim 12, wherein each semiconductor fin portion comprises a same semiconductor material.

18. The anti-fuse structure of claim 12, wherein a distance between the upper-most apex and the lower most apex is in a range of about 1 nanometers to 5 nanometers, preferably between 2 nanometers and three nanometers.

19. The anti-fuse structure of claim 12, wherein each semiconductor fin portion comprises a same dopant type and a same dopant concentration.

20. The anti-fuse structure of claim 12, wherein the lower most apex and the upper most apex are misaligned by no more than 2 nanometers.

* * * * *